(12) United States Patent
Uchida et al.

(10) Patent No.: US 6,787,915 B2
(45) Date of Patent: Sep. 7, 2004

(54) REARRANGEMENT SHEET, SEMICONDUCTOR DEVICE AND METHOD OF MANUFACTURING THEREOF

(75) Inventors: Yasufumi Uchida, Tokyo (JP); Yoshihiro Saeki, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/930,710

(22) Filed: Aug. 16, 2001

(65) Prior Publication Data
US 2002/0121686 A1 Sep. 5, 2002

(30) Foreign Application Priority Data
Mar. 5, 2001 (JP) .................................... 2001-060348

(51) Int. Cl.[7] .................. H01L 23/48; H01L 23/52; H01L 29/40
(52) U.S. Cl. .................. 257/777; 174/52.1; 174/261; 257/686; 257/723; 257/784; 361/733
(58) Field of Search ............................. 257/784, 777, 257/686, 723, 725; 174/250, 255, 52.1, 261; 361/733, 760

(56) References Cited

U.S. PATENT DOCUMENTS

| | | | | | |
|---|---|---|---|---|---|
| 5,012,323 | A | * | 4/1991 | Farnworth | 357/75 |
| 5,502,289 | A | * | 3/1996 | Takiar et al. | 174/266 |
| 5,903,049 | A | * | 5/1999 | Mori | 257/686 |
| 5,953,213 | A | * | 9/1999 | Napierala | 361/760 |
| 6,222,265 | B1 | * | 4/2001 | Akram et al. | 257/723 |
| 6,359,340 | B1 | * | 3/2002 | Lin et al. | 257/777 |
| 6,407,450 | B1 | * | 6/2002 | Verma et al. | 257/697 |
| 6,407,456 | B1 | * | 6/2002 | Ball | 257/777 |
| 6,414,384 | B1 | * | 7/2002 | Lo et al. | 257/685 |
| 6,476,500 | B2 | * | 11/2002 | Kimura | 257/777 |

* cited by examiner

*Primary Examiner*—David A. Zarneke
*Assistant Examiner*—Asok Kumar Sarkar
(74) *Attorney, Agent, or Firm*—Rabin & Berdo, PC

(57) ABSTRACT

There are provided a semiconductor device construction having more degrees of design freedom of the semiconductor element than prior arts, and a method of manufacturing such device easily and at low cost. For this purpose, a rearrangement sheet is employed provided with an insulating sheet and conductive metallic patterns formed on this insulating sheet.

30 Claims, 11 Drawing Sheets

PRIOR ART

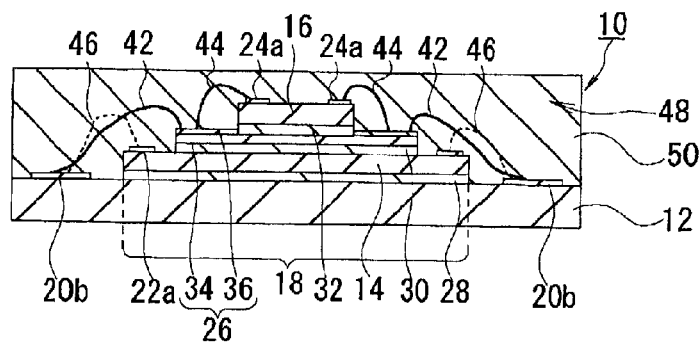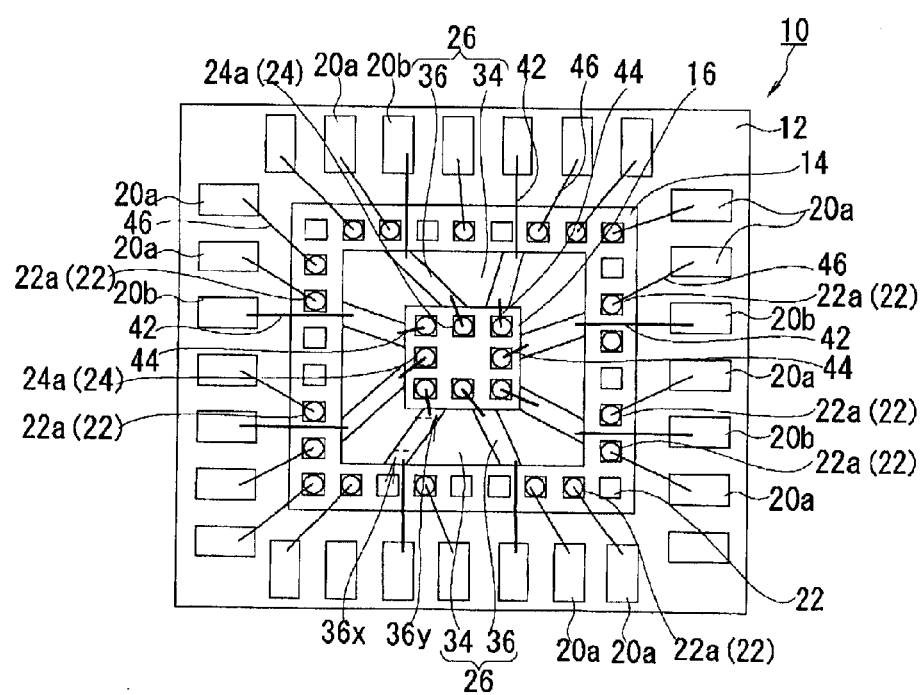

REARRANGEMENT SHEET, SEMICONDUCTOR DEVICE AND METHOD OF MANUFACTURING THEREOF

BACKGROUND OF THE INVENTION

1. Field of the Invention

The present invention relates to a semiconductor device and to a method of manufacture thereof. In particular, it relates to the construction and a method of manufacturing a multi-chip package (MCP) of the type produced by chip and the construction and a method of manufacturing a wafer-level CSP (chip size package).

2. Description of Related Art

FIG. 1 shows an example of a conventional semiconductor device of an MCP (multi-chip package) construction of the type obtained by laminating chips.

FIG. 1A is a plane view seen from above of the arrangement relationships of the structural elements of a semiconductor device. This shows the construction of the underside of the sealing portion. FIG. 1B is a cross-sectional view of a prior art semiconductor device.

As shown in FIG. 1A and FIG. 1B, a first semiconductor element (first element) 504 provided with a plurality of bonding pads 503 is stuck onto the upper surface of a substrate 500 using first adhesive 502. A second semiconductor element (second element) 508 provided with a plurality of bonding pads 507 is stuck onto the upper surface of first element 504 using second adhesive 506. A plurality of bonding posts 510 are provided in the region of the upper surface of substrate 500 other than the region where the first element 504 is mounted. These bonding posts 510 and the bonding pads 503 on first element 504 are connected by first wires 512 constituted by fine metallic leads. Bonding pads 507 on second element 508 and other bonding posts 510 on the upper surface of substrate 500 are connected by second wires 514 constituted by fine metallic leads. As shown in FIG. 1B, sealing portion 516 is formed by sealing such that the entirety of first elements 504, second elements 508, first wires 512 and second wires 514 on the upper surface of substrate 500 is covered by molded resin.

In the conventional wafer-level CSP construction, for example, a further plurality of layers are laminated on the semiconductor element formed with a plurality of bonding pads on the surface. The bonding pads of the semiconductor element and the desired wiring patterns formed on the upper surface of the uppermost layer of the aforementioned plurality of layers are electrically connected by means of through-holes and metallic wiring formed in this plurality of layers. These laminated structures are sealed by molded resin. In a well known construction, the conductive posts are formed so as to be electrically connected with the desired wiring patterns of, for example, the uppermost layer, and the surface of the conductive posts is exposed on the mounting surface of the molded resin.

In the manufacture of such a wafer-level CSP, in a wafer formed with a plurality of semiconductor elements, the step of lamination onto the semiconductor element, the wiring step and the sealing step are performed by processing the plurality of elements simultaneously. CSPs are then obtained by dicing the wafer on which the sealing step has been completed, so as to obtain individual semiconductor element units.

However, in a conventional semiconductor device as shown in FIG. 1, when connecting second wires 514 to the bonding pads 507 on second element 508 and bonding posts 510 on substrate 500, depending on the positions of bonding posts 510, there is a risk of short-circuiting of the first wires 512 and second wires 514 that are used to connect bonding pads 503 of first element 504 and bonding posts 510 on the substrate 500.

In order to prevent such short-circuiting of the first wires 512 and the second wires 514, the positions of bonding pads 503 on the first element 504 whereby first wires 512 are arranged and the positions of bonding pads 507 on second element 508 whereby second wires 514 are arranged must be respectively selected such that short-circuiting does not occur. The positions of bonding pads 503 and 507 for which wiring is possible are therefore severely restricted, so the degrees of design freedom of the semiconductor element are reduced.

In order to solve the problems described above, there has been a demand for a construction of a semiconductor device (MCP or wafer-level CSP) which will increase the degree of design freedom of semiconductor elements compared to the prior art and a method of manufacturing such a device easily and at low cost.

Particularly, in a conventional wafer-level CSP, a plurality of layers are laminated on the semiconductor element and the bonding pads are rearranged on the uppermost surface of the layers, so it is not easy to effect further rearrangement in response to demands from the user. Furthermore, in manufacture, it was necessary to redevelop all of the wiring steps and lamination steps onto the semiconductor element: such redevelopment took time.

There has been a demand for a wafer-level CSP construction which makes it easier to reposition the bonding pads compared to the prior art. Further, there also has been a demand for a method of manufacturing such a wafer-level CSP.

Accordingly, one object of the present invention is to provide a semiconductor device, specifically, MCP or wafer-level CSP, having a high degree of design freedom semiconductor elements.

Another object of the present invention is to provide a method of manufacturing such a device easily and at low cost.

Another object of the present invention is to provide a rearrangement sheet applied to a semiconductor device.

Still another object of the present invention is to provide a method of manufacturing such a rearrangement sheet.

SUMMARY OF THE INVENTION

The inventors of the present invention succeeded in developing a novel rearrangement sheet applied to a semiconductor device whereby rearrangement of the bonding pads can easily be performed.

The rearrangement sheet comprises an insulating sheet and conductive metallic patterns formed on this insulating sheet.

The rearrangement sheet is formed as follows.

Specifically, a plurality of masks corresponding to the shape of conductive metallic patterns in single units is provided on an insulating film. Using the masks, a plurality of conductive metal plated patterns in single chip units are formed on the insulating film.

After removing the masks, the insulating film is divided into each single chip unit to obtain a plurality of rearrangement sheets.

For example, in an MCP of the type in which chips are laminated, the rearrangement sheet may be interposed between the first element and second element of a structure in which the first element and second element are laminated in this order on a substrate. When bonding posts formed on the substrate, the bonding pads of the first element and the bonding pads of the second element must be respectively connected, the bonding posts and the conductive metallic patterns of the rearrangement sheet are connected and these conductive metallic patterns and the bonding pads of second element are connected. Next, the bonding posts and the bonding pads of the first element are subjected to wire bonding as normally. Since the conductive metallic patterns can be provided in desired positions on the rearrangement sheet, connection between the bonding pads of the second element and the bonding posts can be effected irrespective of the positions of the metal wires that connect the bonding pads of the first element and the bonding posts. So, by the rearrangement sheet of the present invention, for example in the example described above, rearrangement of the bonding pads of the second element can easily be performed, thereby making it possible to increase the degrees of design freedom of the second element.

As an example of use of a rearrangement sheet according to the present invention, for example the case of application to a wafer-level CSP may be considered. In a wafer-level CSP, the rearrangement sheet is provided in a region of the semiconductor element provided with the plurality of bonding pads where the bonding pads are not formed. The conductive metallic patterns of the rearrangement sheet are constituted by, for example, rearrangement posts of the same number as the bonding pads, wire connection portions of the same number as the bonding pads, and rewiring leads that connect the rearrangement posts and the wire connection portions. The wire connection portions can be formed at positions where connection with the bonding pads of the rearrangement sheet can easily be effected, so connection of the bonding pads and wire connection portions can easily be performed by wire bonding. The conductive posts are provided on the rearrangement posts that are connected to the wire connection portions and the rewiring leads. The upper surface of the semiconductor element is sealed such that the upper surfaces of these conductive posts are exposed. In this way, the bonding pads of the semiconductor device can easily be rearranged on the conductive posts that are exposed from the sealed portion.

Rearrangement of the electrodes onto the conductive metallic patterns can therefore easily be performed by sticking a rearrangement sheet according to the present invention formed with conductive metallic patterns in desired positions onto the under-layer where the electrodes that are to be rearranged are provided.

BRIEF DESCRIPTION OF THE DRAWINGS

The foregoing and other objects, features and advantages of the present invention will be better understood from the following description taken in connection with the accompanying drawings in which:

FIG. 2A is a diagrammatic cross-sectional view of a semiconductor device according to a first embodiment of the present invention;

FIG. 2B is a plane view seen from above of FIG. 2A of the present invention;

DESCRIPTION OF THE PREFERRED EMBODIMENTS

Figure 1A:
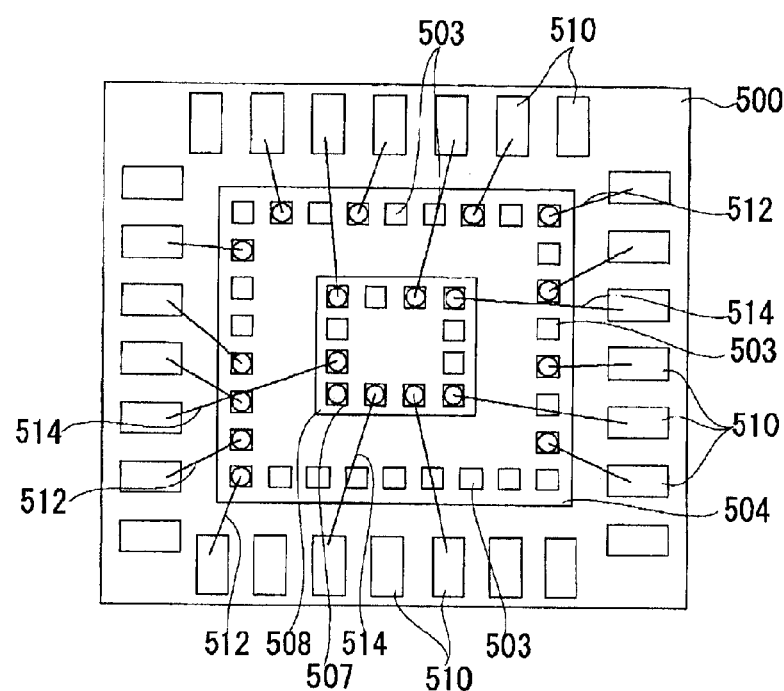
FIG. 1A is a plan layout view seen from above of a prior art semiconductor device.
Figure 1B:
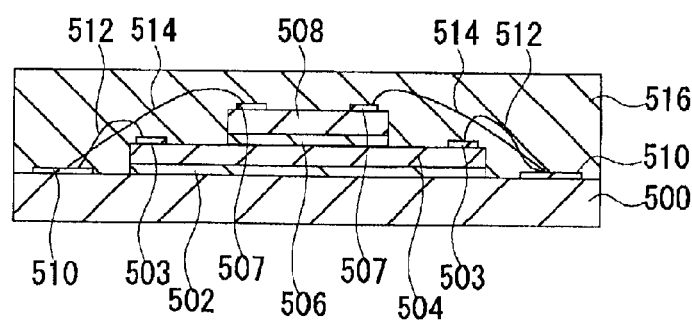
FIG. 1B is a cross-sectional view of FIG. 1A.

Embodiments of the present invention are described below with reference to the drawings. However, it should be noted that in the drawings the shape, size and arrangement relationships of the various structural constituents are shown only diagrammatically such as to enable the invention to be understood; the present invention is therefore not restricted to the illustrated examples. Also, in the Figures, the hatching designating the cross section is partially omitted in order to facilitate understanding of the drawings.

<First Embodiment>

As the first embodiment of present invention, an example will be described, referring to FIGS. 2A and 2B, and FIGS. 3A and 3B, wherein a rearrangement sheet is provided on an MCP of laminated chip type.

Figure 3A:
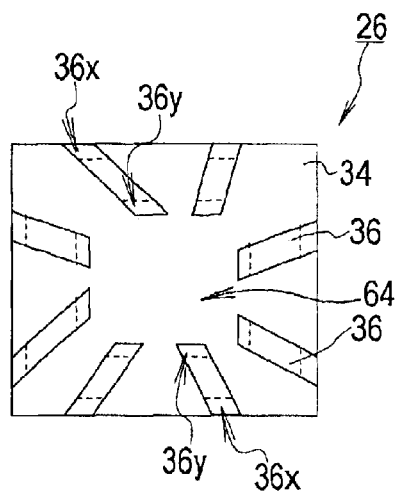
FIG. 3A is a plane view seen from above of a rearrangement sheet according to a first embodiment of the present invention.
Figure 3B:
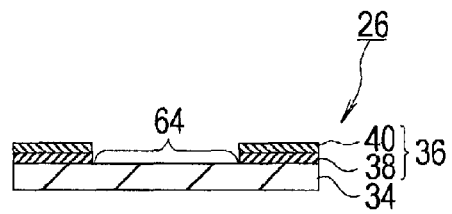
FIG. 3B is a cross-sectional view of FIG. 3A.

FIG. 2A is a cross-sectional view given in explanation of the construction of an MCP according to this embodiment. FIG. 2B is a plane view seen from above the MCP, showing the arrangement relationships of the various structural elements on the underside of the sealing portion. FIG. 3A is a plane view seen from above of a rearrangement sheet according to this embodiment. FIG. 3B is a cross-sectional view of the rearrangement sheet.

FIGS. 2A and 2B show a semiconductor device (MCP) 10 in which there are provided a substrate 12 and, in this order, a first semiconductor element (called a first element) 14 and a second semiconductor element (called a second element) 16 on this substrate 12. A plurality of bonding posts 20a and 20b are formed in the region on the upper surface of substrate 12 apart from the region 18 where the first element is formed. Respective pluralities of bonding pads 22 and 24 are also formed on the upper surfaces of first element 14 and second element 16. The bonding pads of first element 14 will be referred to as first pads 22 and the bonding pads of second element 16 will be referred to as second pads 24.

Of the plurality of bonding posts 20a and 20b, those connected to the first pads 22 will be termed posts 20a for connection with the first pads and those connected to second pad 24 will be termed posts 20b for connection to the second pads. Of first pads 22, those connected with bonding posts 20 will be termed first pads 22a for post connection and of the second pads 24, those connected with bonding posts 20 will be termed second pads 24a for post connection.

In this embodiment, rearrangement sheet 26 is interposed between first element and 14 and second element 16. First element 14 is fixed by first adhesive 28 on substrate 12. Rearrangement sheet 26 is fixed by second adhesive 30 on first element 14. Second element 16 is fixed by third adhesive 32 on rearrangement sheet 26. For the adhesive (28, 30, 32), die bonding paste such as is conventionally employed for die bonding can be employed. This is conventionally constituted by for example epoxy resin. Liquid epoxy resin is dropped onto the under-layer in each case (substrate 12, first element 14 and rearrangement sheet 26) and bonding is effected by placing first element 14, second element 16 or sheet 26 thereon.

As shown in FIGS. 3A and 3B, rearrangement sheet 26 is equipped with an insulating sheet 34 and a plurality of electric conductive metallic patterns 36 formed on this insulating sheet 34. In this example, conductive metallic patterns 36 are constituted by underlying plated patterns 38 and conductive metal plated patterns 40 (FIG. 3B). As shown in FIG. 2B, conductive metallic patterns 36 are formed in a region on insulating sheet 34 that is exposed from second element 16. The respective conductive metallic patterns 36 are continuously formed (see FIG. 2B and FIG. 3A) extending over the region including first position 36x that can be reached by the straight line extending from posts 20b for connecting second pads towards insulating sheet 34 (rearrangement sheet 26) without coming into contact with first pads 22 and second position 36y at which wire bonding with second pads 24a for post connection is possible.

Conductive metallic patterns 36 and posts 20b connecting second pads are connected by first relay wires 42. Likewise, conductive metal patterns 36 and second pads 24a for post connection are connected by means of second relay wires 44 (see FIG. 2A and FIG. 2B). As a result, the second posts 20b for second pad connection and second pads 24a for post connection can be electrically connected through conductive metallic patterns 36.

First posts 20a for pad connection and first pads 22a for post connection are connected by first wires 46 (see FIG. 2A and FIG. 2B).

Sealing portion 50 is formed so as to effect sealing by molded resin 48 so as to cover first element 14, rearrangement sheet 26, second element 16, first wires 46, first relay wires 42 and second relay wires 44 on the upper surface of substrate 12.

As described above, in this embodiment, rearrangement sheet 26 provided with conductive metallic patterns 36 is provided between first element 14 and second element 16 of MCP 10. Consequently, electrical connection of second pads 24a for post connection of second element 16 and posts 20b for second pad connection is effected by connection of second pads 24a for post connection and conductive metallic patterns 36 of rearrangement sheet 26 and likewise by connection of conductive metallic patterns 36 and posts 20b for second pad connection.

Conductive metallic patterns 36 of sheet 26 for rearrangement are formed in a region including position (second position) 36y where connection with second pads 24a for post connection is easy and position (first position) 36x where the straight line extending from posts 20b for second pad connection on substrate 12 towards sheet 26 for rearrangement reaches sheet 26 for rearrangement without contacting first bonding pads 22 on first element 14. Consequently, electrical connection of second pads 24a for post connection and posts 20b for second pad connection can easily be performed irrespective of the position of second pads 24a for post connection, so the degrees of freedom of design of second element 16 can be increased.

First relay wires 42 are employed for connection of posts 20b for second pad connection and conductive metallic patterns 36. Second relay wires 44 are employed for connection of second pads 24a for post connection and conductive metallic patterns 36. The respective lengths of the first relay wires 42 and second relay wires 44 are much shorter than the length of the metallic wire that is employed for direct connection of second pads 24a for post connection from posts 20b for second pad connection. In the steps subsequent to the step of connecting the first relay wires 42 and second relay wires 44, the rate of occurrence of defects produced by deformation of or damage to the first relay wires 42 and second relay wires 44 can be greatly reduced. Consequently, the yield of MCP manufacture can be increased.

Since, as described above, the length of first relay wires 42 and second relay wires 44 is short, the height of the wire loops can be reduced. Consequently, the thickness of the package can be reduced.

Next, an example of a method of manufacturing a rearrangement sheet 26 used in a semiconductor device 10 according to this embodiment will be described with reference to FIG. 4A to FIG. 4D.

FIG. 4A to FIG. 4D are diagrams of the steps for manufacturing a rearrangement sheet 26. The layout of the structural members in the main steps in manufacture is illustrated by plane views seen from above or cross-sectional views.

First of all, a plurality of masks corresponding to the shape of the conductive metallic patterns provided for each chip that are subsequently to be formed are arranged above insulating film 34x.

In this embodiment, masks are provided corresponding to the pattern shapes of conductive metallic patterns 36, which are designed taking into account the position of second element 16, the positions of relay second pads 24a for post connection, and the positions of posts 20b for second pad connection, on insulating film 34x constituted by a material having hardness such as to enable its use for wire bonding, for example epoxy resin or polyimide. These masks are formed of metal of excellent fine processing properties, such as for example Cu (copper). A plurality of these patterns that are formed per chip are formed repeated longitudinally and laterally (not shown).

Next, using the masks, a plurality of conductive metal plated patterns 40 in single chip units are formed on insulating film 34x.

Figure 4A:
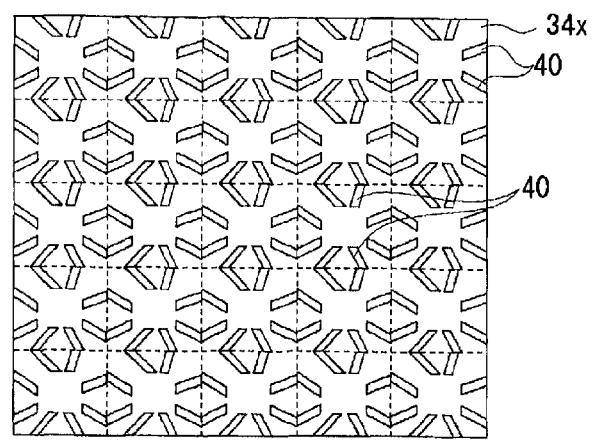
FIG. 4A to FIG. 4D are views showing steps of manufacturing a rearrangement sheet according to a first embodiment of the present invention.

Consequently, in this embodiment, using the aforesaid masks, underlying plated patterns 38 are formed using a non-electrolytic plating method, in the region where conductive metal plated patterns 40 are to be formed (see FIG. 3B). For underlying plated patterns 38, in this case Ni (nickel) is employed. Next, using these underlying plated patterns 38 as electrode, conductive metal plated patterns 40 are formed on underlying plated patterns 38 by an electrolytic plating method. As materials for conductive metal plated patterns 40, noble metals such as Au (gold), Pd (palladium), or Cu (copper) etc can be employed. In this example, Au is employed. In this way, as shown in FIG. 4A, a plurality of conductive metal plated patterns 40 are formed on insulating film 34x. FIG. 4A is a diagrammatic plane view seen from above insulating film 34x. The region on insulating film 34x surrounded by the broken line is the region constituting the rearrangement sheet provided for each chip.

Next, after removing the masks, insulating film 34x that has been formed with a plurality of conductive metal plated patterns 40 provided for each chip is divided into single chip units, thereby forming a plurality of insulating sheets 34 equipped with conductive metal plated patterns 40 in single chip units.

Figure 4B:
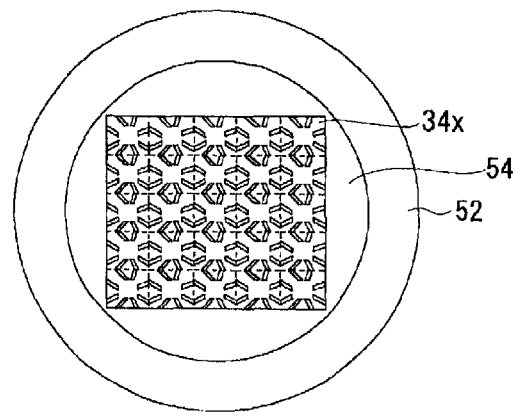
Figure 4C:
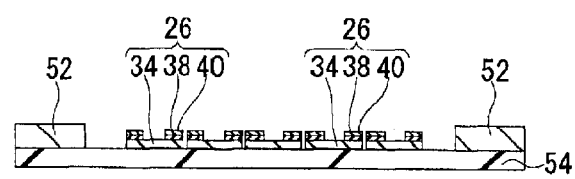

Consequently, in this embodiment, a typically employed dicing machine is provided. Thus there is provided at least equipment comprising a scribe ring 52, scribing tape 54 and pushing-up mechanism component 56. Insulating film 34x formed with conductive metal plated patterns 40 is fixed to scribe ring 52 by means of scribing tape 54 (FIG. 4B). Next, insulating film 34x is divided along the cut lines i.e. the lines indicated by the broken lines on insulating film 34x of FIG. 4A (FIG. 4C). FIG. 4B is a plane view seen from above of insulating film 34x fixed to the dicing machine and FIG. 4C is a cross-sectional view of the structure immediately after division of insulating film 34x into the individual insulating sheets 34. Division of insulating film 34x converts it into a plurality of rearrangement sheets 26 comprising insulating sheets 34 and conductive metallic patterns 40 (FIG. 4C).

Figure 4D:
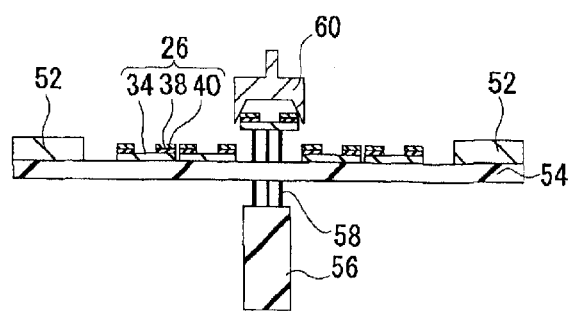

Next, pushing-up pin 58 of pushing-up mechanism component 56 is pushed up. By this means, one of the rearrangement sheets 26 is pushed up. This rearrangement sheet 26 that has been pushed up is further pulled up by a collet 60 (FIG. 4D).

After this, the respective rearrangement sheets 26 are stuck onto the first element 14 by an ordinary die bonding step (see FIG. 2A and FIG. 2B).

In this way, rearrangement sheets 26 to be used in MCP 10 of FIG. 2 can be manufactured.

As a result, rearrangement sheets 26 can be easily manufactured using a conventional dicing machine and it is not necessary to invest in new equipment. Manufacturing costs can thereby be lowered.

<Second Embodiment>

Figure 5A:
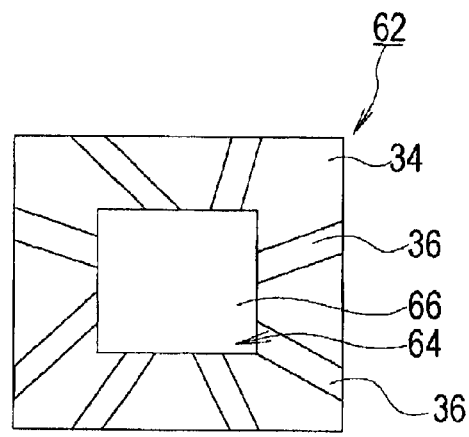
FIG. 5A is a plane view seen from above of a rearrangement sheet according to a second embodiment of the present invention.
Figure 5B:
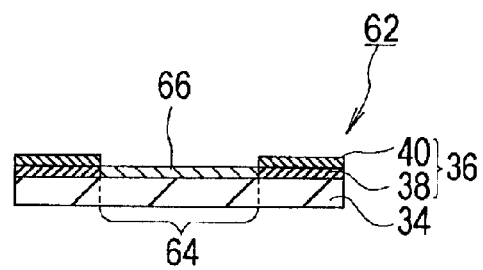
FIG. 5B is a layout diagram of a cross section of FIG. 5A of the present invention.

A second embodiment is described with reference to FIG. 5. In this embodiment, the structure of the MCP is the same as in the case of the first embodiment, but the layout of the rearrangement sheet is different. FIG. 5A is a view showing diagrammatically the layout of a rearrangement sheet according to this embodiment. It is a plane view seen from above. FIG. 5B is a cross-sectional view of a rearrangement sheet according to this embodiment. In FIG. 5, structural elements which are the same as in the case of the first embodiment are given the same reference symbols.

Rearrangement sheet 62 according to this embodiment comprises an insulating sheet 34 and conductive metallic patterns 36 formed on this insulating sheet 34. Conductive metallic patterns 36 are electrodes for wire bonding with external electrodes. The external electrodes referred to in this embodiment are posts 20b for second pad connection on substrate 12 and second pads 24a for post connection on second element 16 (see FIG. 2).

Element mounting region 64 is provided in a region on insulating sheet 34 other than the region where conductive metallic patterns 36 are formed. Insulating adhesive sheet 66 is formed in element mounting region 64.

In this embodiment, the element that is mounted on element mounting region 64 is second element 16. As the material of insulating adhesive sheet 66, a material having adhesive properties when heated may be employed. In particular, a material having both the properties of thermoplasticity and heat curing may be employed. For example, composite materials with epoxy resin and polyamide resin may be employed. This insulating adhesive sheet 66 is provided in semi-cured condition. A "semi-cured condition" as referred to herein means a condition in which the material of insulating adhesive sheet 66 which is applied on the under-layer is cured at ordinary temperature (room temperature) or low temperature (40 to 50° C.).

In this way, since insulating adhesive sheet 66 is provided beforehand on the element mounting region 64 of rearrangement sheet 62, when sticking the second element 16 onto rearrangement sheet 62 when manufacturing the MCP of this embodiment, the step of applying adhesive can be eliminated. In this embodiment, in the step of mounting second element 16 on rearrangement sheet 62, insulating adhesive sheet 66 and second element 16 are stuck on by performing application of pressure and heat treatment after placing second element 16 on insulating adhesive sheet 66.

As a result, the processing time can be reduced by about one hour compared with the case where a series of processes is performed comprising applying adhesive onto rearrangement sheet 62 then mounting and fixing second element 16.

Rearrangement sheet 62 may be manufactured using practically the same method as described in the case of the first embodiment.

First of all, masks corresponding to the shapes of conductive metallic patterns 36 are provided on insulating film 34x. Next, a plurality of underlying plated patterns 38 and conductive metal plated patterns 40 are formed on insulating film 34x using the masks. After the masks have been removed, insulating film 34x on which the conductive metal plated patterns 40 have been formed is divided (see FIG. 4).

In this embodiment, for example epoxy resin is selectively applied onto element forming region 64 before arranging the masks above insulating film 34x. After this, this may be left to stand at ordinary temperature or cured by heating at low temperature (40 to 50° C.). At this stage, the curing reaction is not completely finished. This semi-cured film is termed insulating adhesive sheet 66. After this, subsequent steps are performed by arranging masks above insulating film 34x. Alternatively, insulating adhesive sheet 66 may be provided in the same way as described above prior to division of insulating film 34x but after formation of the conductive metal plated patterns 40. Insulating film 34x is then divided up after this.

<Third Embodiment>

Figure 6A:
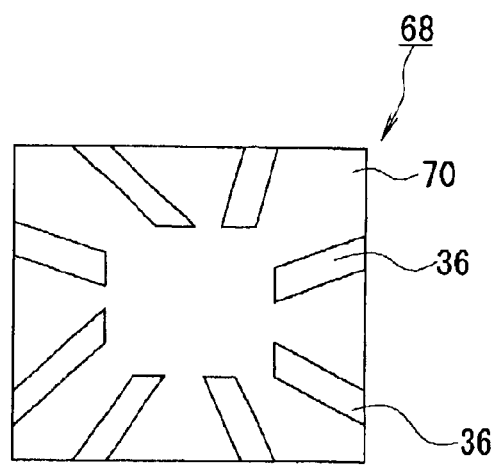
FIG. 6A is a plane view seen from above of a rearrangement sheet according to a third embodiment of present invention.
Figure 6B:
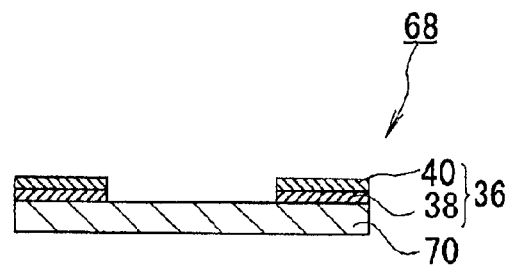
FIG. 6B is a layout diagram of a cross section of FIG. 6A of the present invention.

A third embodiment is described with reference to FIG. 6. In this embodiment, the construction of the MCP is the same as in the case of the first embodiment, but the layout of the rearrangement sheet is different. FIG. 6A is a view showing diagrammatically the layout of the rearrangement sheet according this embodiment. It is a plane view seen from above. FIG. 6B is a cross-sectional view of this rearrangement sheet.

Rearrangement sheet 68 according to this embodiment comprises an insulating adhesive sheet 70 and conductive metallic patterns 36 formed on this insulating adhesive sheet 70. Conductive metallic patterns 36 are electrodes for wire bonding with external electrodes. In this embodiment the external electrodes are posts 20b for second pad connection on substrate 12 and second pads 24a for post connection on second element 16 (see FIG. 2).

In this embodiment, the entirety of the sheet where the conductive metallic patterns 36 are formed is constituted by insulating adhesive sheet 70. As the material of insulating adhesive sheet 70, the same material as that of insulating adhesive sheet 66 of the second embodiment may be employed. For example, composite materials of epoxy resin and polyamide resin may be employed. This insulating adhesive sheet 70 is provided in semi-cured condition. A "semi-cured condition" as referred to herein means a condition in which the material of insulating adhesive sheet 70 in liquid form is cured at ordinary temperature (room temperature) or low temperature (40 to 50° C.).

With the rearrangement sheet 68 according to this embodiment, conductive metallic patterns 36 are formed on this insulating adhesive sheet 70 using insulating adhesive sheet 70 instead of the insulating sheet 34 of the first embodiment. As a result, in the manufacture of an MCP according to this embodiment, in the step of sticking rearrangement sheet 68 onto the first element 14 and the step of sticking second element 16 onto rearrangement sheet 68, the steps of applying the respective adhesive may be omitted. In this embodiment, first of all, rearrangement sheet 68 is placed on first element 14. Next, after second element 16 has been placed on rearrangement sheet 68, pressure is applied and heat treatment is performed. First element 14, rearrangement sheet 68 and second element 16 are then stuck together.

As a result, processing time can be greatly reduced compared with when a series of processes of fixing are performed after respective applications of adhesive between first element 14 and rearrangement sheet 68, and between rearrangement sheet 68 and second element 16.

Since adhesive for respectively sticking together first element 14 and rearrangement sheet 68, and rearrangement sheet 68 and second element 16 is unnecessary, compared with the case where adhesive is used, the thickness of the MCP as a whole can be reduced by 30 to 50 μm. It is therefore possible to further reduce the thickness of the semiconductor device.

<Fourth Embodiment>

A fourth embodiment is described with reference to FIG. 7 to FIG. 9. This embodiment is an example in which a rearrangement sheet is provided on a wafer-level CSP.

Figure 7A:
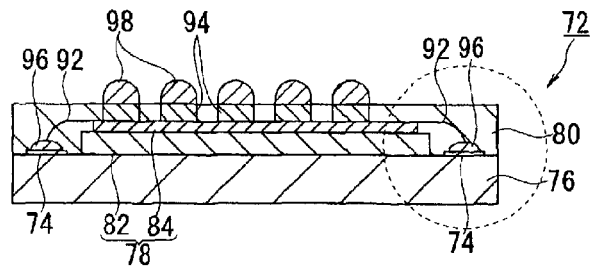
FIG. 7A is a cross-sectional view of a semiconductor device according to a fourth embodiment of the present invention.
Figure 7B:
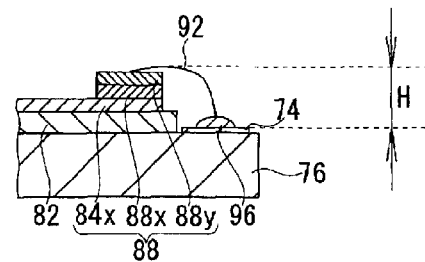
FIG. 7B is a detail view to a larger scale of FIG. 7A.
Figure 7C:
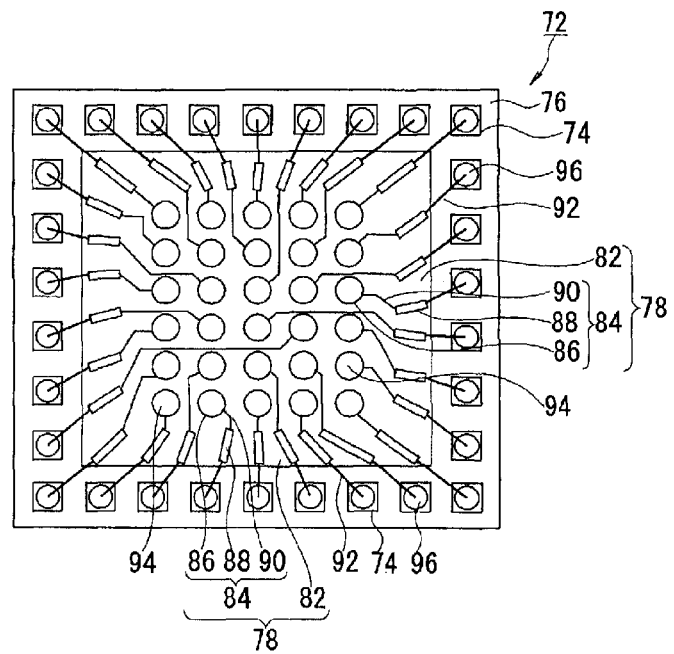
FIG. 7C is a plane view seen from above of a semiconductor device.

FIG. 7A is a cross-sectional view given in explanation of the construction of a wafer-level CSP according to this embodiment. FIG. 7B is a view to a larger scale of the portion surrounded by the broken lines in FIG. 7A. FIG. 7C is a plane view seen from above of the wafer-level CSP of this embodiment. This illustrates the arrangement relationship of the external connection terminals and the structural elements on the underside of the sealing portion.

As shown in FIGS. 7A to 7C, the semiconductor device (wafer-level CSP) 72 of this embodiment comprises a semiconductor element 76 that is formed with a plurality of bonding pads 74 on its upper surface, a rearrangement sheet 78 that is stuck onto the region of semiconductor elements 76 where bonding pads 74 are not formed, and a sealing portion 80 that seals the upper surface of the semiconductor element 76 such that rearrangement sheet 78 is covered (FIG. 7A).

Rearrangement sheet 78 comprises insulating sheet 82 and conductive metallic pattern 84 electrically connected with bonding pads 74. Insulating sheet 82 may be stuck by adhesive onto the element as described in the first embodiment, or an insulating adhesive sheet may be employed as described in the third embodiment. Conductive metallic patterns 84 comprise at least the same number of rearrangement posts 86 as bonding pads 74 of semiconductor element 76, the same number of wire connection portions 88 as rearrangement posts 86, and rewiring leads 90 that connect rearrangement posts 86 and wire connection portions 88 (FIG. 7C).

Conductive metallic patterns 84 can be all wiring metallic patterns or can be all conductive metal plated patterns. If they are conductive metal plated patterns, the conductive metal plated patterns may be formed with underlying plated patterns interposed. If there is good adhesion with the adhesive sheet, the conductive metal plated patterns may be formed directly on the insulating sheet. The patterns of the rearrangement posts 86, wire connection portions 88 and rewiring leads 90 are formed on insulating sheet 82 by wiring metallic patterns. As shown in FIG. 7B, conductive metal plated patterns 88y may be formed, with underlying metallic patterns 88x interposed, on Cu wiring patterns 84x of wire connection portion 88 in accordance with the metal of the wire that is connected to the wire connection portions 88.

Wire connection portions 88 and bonding pads 74 are connected by metal wires 92 (FIG. 7A and FIG. 7B).

Conductive posts 94 are formed on the upper surface of rearrangement posts 86. Part of these conductive posts 94 is exposed from sealing portion 80 (FIG. 7A).

In this embodiment, the connection of for example wire connection units 88 and bonding pads 74 is effected by means of Au wire 92. First, a copper plating film is therefore formed on insulating sheet 82. A resist pattern corresponding to the shape of an rearrangement posts 86, wire connection portions 88 and rewiring leads 90 is formed in on this copper plating film. Next, etching of the copper plating film is performed using the resist pattern as a mask. Cu wiring patterns 84x corresponding to the shape of rearrangement posts 86, wire connection portions 88 and rewiring leads 90 are thus formed. Next, conductive metal plated patterns 88y made of Au are formed on Cu wiring patterns 84x of wire connection portions 88 with underlying plated patterns 88x interposed (see FIG. 7B). The wire connection portions 88 of this embodiment are therefore constituted by Cu wiring patterns 84x, underlying plated patterns 88x and conductive metal plated patterns 88y.

In this way, a rearrangement sheet 78 according to this embodiment is obtained.

In this embodiment, the connection by Au wire 92 between the wire connection portions 88 and the bonding pads 74 on the semiconductor element 76 is achieved as follows. Metal balls 96 of Au are formed on bonding pads 74. These metal balls 96 and wire connection portions 88 which are in a position higher than metal balls 96 are connected using a wire bond launching system. In this way, the height H of the wire loops can be reduced compared with a method in which wire bonding is performed from the wire connection portions 88 to the bonding pads 74 (see FIG. 7B).

In this embodiment, conductive posts 94 made of Au are formed on the upper surface of rearrangement posts 86. Sealing portion 80 sealed by molded resin is formed on the upper surface of semiconductor element 76 such that conductive posts 94 and Au wires 92 are covered. However, part (the upper face) of conductive posts 94 is exposed from sealing portion 80. The thickness of sealing portion 80 should therefore be a thickness sufficient to cover Au wires 92. The height of conductive posts 94 should be set to match the thickness of sealing portion 80.

Since, in this embodiment, the height H of the wire loop between wire connection portions 88 and bonding pads 74 can be made lower (see FIG. 7B), the height of conductive posts 94 can also be made lower. Consequently, further reduction in the thickness of semiconductor device 72 can be achieved.

For example, solder balls 98 are provided on the upper surface of conductive posts 94 that are exposed from sealing portion 80. These solder balls 98 are employed as connection terminals with the outside. It is also possible to employ these by placing them such that the upper surfaces of conductive posts 94 make contact with members where the connection electrodes are formed.

As a result, with the semiconductor device 72 of this embodiment, simply by altering the conductive metallic patterns 84 of rearrangement sheet 78, the pin assignments and/or wiring can be altered. In this way, this semiconductor device 72 can be flexibly adapted to users' requests. Also, such adaptation can be performed inexpensively, since it is only necessary to alter the rearrangement sheet 78.

Connection of rearrangement sheet 78 and bonding pads 74 on the elements is achieved by means of wire bonding. The rearrangement of the bonding pads 74 is performed exclusively by pattern setting of the rewiring leads 90 between rearrangement posts 86 and wire connection portions 88 on the rearrangement sheet 78. Rearrangement of the bonding pads 74 can therefore be performed more easily than hitherto.

This semiconductor device 72 is of a construction in which known reliable semiconductor elements 76 are stuck together with a rearrangement sheet 78 whose reliability is easy to check since it is of simple construction. A device 72 of higher reliability than conventional devices can therefore be achieved.

Next, an example of a method of manufacturing a semiconductor device according to this embodiment will be described with reference to FIG. 8 and FIG. 9.

FIG. 8A to FIG. 8D are diagrams of the manufacturing steps of a semiconductor device according to this embodiment. They show cross-sections of the main steps. FIG. 9A to FIG. 9C are diagrams of manufacturing steps subsequent to FIG. 8D.

Figure 8A:
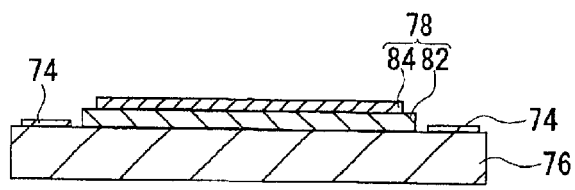
FIG. 8A to FIG. 8D are diagrams of the steps of manufacturing a semiconductor device according to a fourth embodiment of the present invention.
Figure 9A:
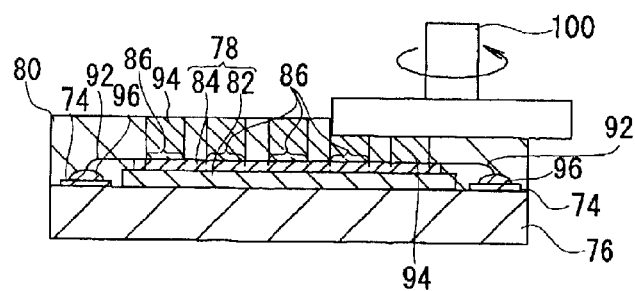
FIG. 9A to FIG. 9C are diagrams of steps subsequent to FIG. 8A to FIG. 8D for manufacturing a semiconductor device according to a fourth embodiment of the present invention.
Figure 9B:
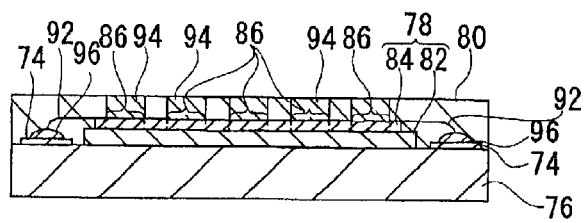
Figure 9C:
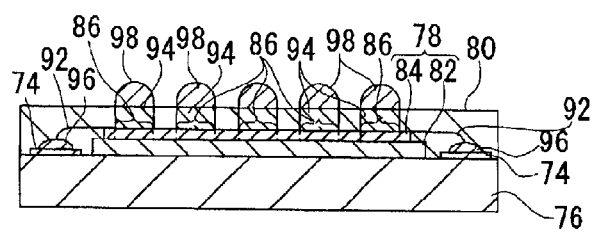

First of all, rearrangement sheet 78 provided with conductive metallic patterns 84 is stuck onto insulating sheet 82 in a region of the upper surface of semiconductor element 76 where the plurality of bonding pads 74 are provided, which is exposed from bonding pads 74 (FIG. 8A).

Conductive metallic patterns 84 of rearrangement sheet 78 are constituted by rearrangement posts 86, wire connection portions 88, and rewiring leads 90 that connect rearrangement posts 86 and wire connection portions 88 (see FIG. 7C).

Next, bonding pads 74 and wire connection portions 88 of conductive metallic patterns 84 are connected by fine metallic leads 92.

Figure 8B:
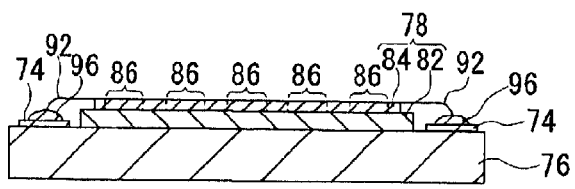

In order to achieve this, in this embodiment, connection is performed using the wire bond launching system. Metal balls 96 of Au are formed on bonding pads 74. Bonding with wire connection portions 88 is performed such that the Au wires 92 are pulled up from these metal balls 96 (FIG. 8B).

Continuing from this step, conductive posts 94 are formed by stud bumps produced by wire bonds, on the rearrangement posts 86, of the conductive metallic patterns 84.

Figure 8C:
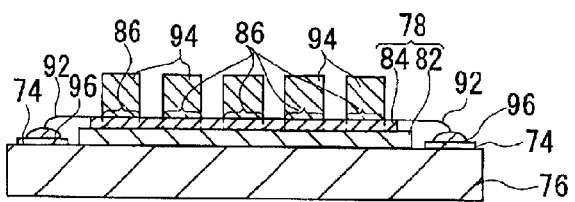

In order to achieve this, in this embodiment, stud bumps made of Au are formed by wire bonds as conductive posts 94 (FIG. 8C).

Figure 8D:
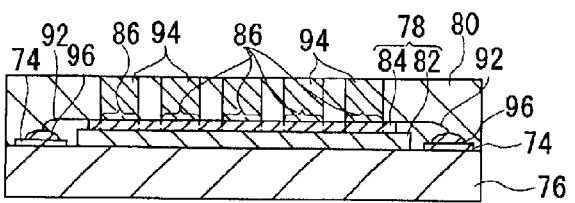

Next, sealing portion 80 is formed by sealing using molded resin such that the bonding pads 74 on the upper surface of semiconductor element 76, rearrangement sheet 78, fine metallic wires 92 and conductive posts 94 are covered (FIG. 8D).

Next, the upper surfaces of conductive posts 94 are exposed from sealed portion 80 by grinding the surface of sealed portion 80.

To achieve this, in this embodiment, the surface of the molded resin is ground using a grinding machine 100 until the upper surfaces of conductive posts 94 are exposed (FIG. 9A and FIG. 9B). FIG. 9A is a cross-sectional view of the structure during the grinding process. FIG. 9B is a cross-sectional view of the structure immediately after completion of grinding.

Next, for example solder balls 98 are formed on the upper surface of the exposed conductive posts 94 (FIG. 9C).

In this method of manufacture, connection of the wire connection portions 88 and bonding pads 74 is effected using the wire bond launching system. Next, stud bumps constituting conductive posts 94 are formed on rearrangement posts 86 by continuous wire bonding.

Formation of these conductive posts 94 was conventionally effected using the electrolytic plating method. In simple terms, after forming a mask such that only the rearrangement posts are exposed, for example, Cu is plated onto the rearrangement posts by electrolytic plating. Next, the mask is removed.

Comparing this with conventional art, in the method of manufacture of this embodiment, the step of forming conductive posts 94 can be performed using wire bonding continuously from the step of connecting wire connection portions 88 and bonding pads 74. Consequently, since the steps of mask formation and plating film formation are unnecessary, manufacturing costs can be made lower than conventional art.

<Fifth Embodiment>

As a fifth embodiment, an example of a method of manufacturing a semiconductor device according to the fourth embodiment at wafer level will be described with reference to FIG. 10 and FIG. 11.

Figure 10A:
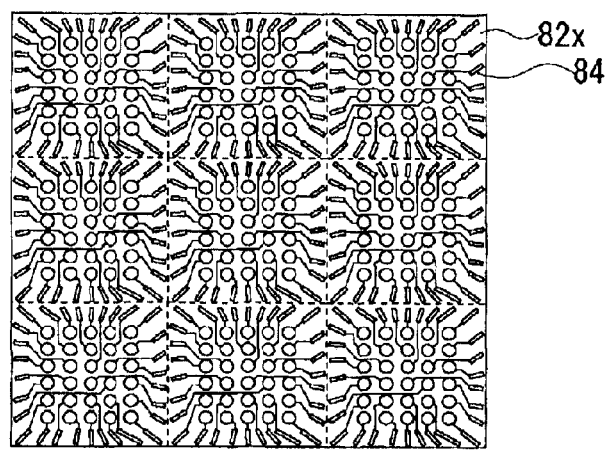
FIG. 10A to FIG. 10D are diagrams of the steps of manufacturing a semiconductor device according to a fifth embodiment of the present invention.

FIG. 10A to FIG. 10D are step diagrams illustrating the steps of manufacture of a wafer-level CSP according to this embodiment. FIG. 11A to FIG. 11C are manufacturing step diagrams subsequent to FIG. 10D. FIG. 10A to FIG. 10D show views considered to be easy to understand, of plane views and cross-sectional views seen from above the structure during the course of its manufacture. FIG. 11A to FIG. 11C show a semiconductor wafer in plane view seen from above.

FIG. 11A and FIG. 11B are views which, combined, show to a larger scale the upper surface of a single element of the plurality of semiconductor elements on the semiconductor wafer.

First of all, a plurality of rearrangement sheets are formed together in the same way as in the first embodiment. After this, a plurality of masks corresponding to the shapes of the conductive metallic patterns 84 in single chip units that is formed on this insulating film 82x are provided on insulating film 82x. In this embodiment, insulating film 82x is an insulating adhesive film. Insulating adhesive film 82x is for example a film (semi-cured film) in a condition in which the curing reaction is not completed, obtained by curing a mixed material consisting of liquid epoxy resin and polyimide resin at ordinary temperature (room temperature) or low temperature (40 to 50° C.). Conductive metallic patterns 84 are patterns corresponding to the shape of rearrangement posts 86, wire connection portions 88, and rewiring leads 90 that connect rearrangement posts 86 and wire connection portions 88 (see FIG. 7C). Next, conductive metallic patterns 84 are formed using this mask. These conductive metallic patterns 84 may be formed solely by wiring metallic patterns, or may be constituted by conductive metal plated patterns, or may be constituted by wiring metallic patterns and conductive metal plated patterns partially formed on the wiring metallic patterns (FIG. 10A).

Next, insulating adhesive film 82x on which the conductive metallic patterns 84 are formed is divided up into each rewiring sheet 78 using an ordinary dicing machine.

Figure 10B:
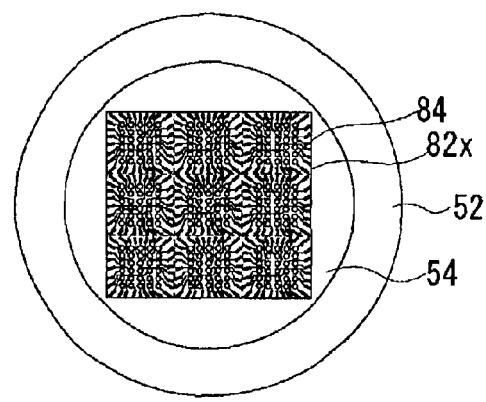
Figure 10C:
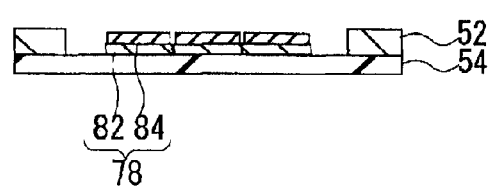
Figure 11A:
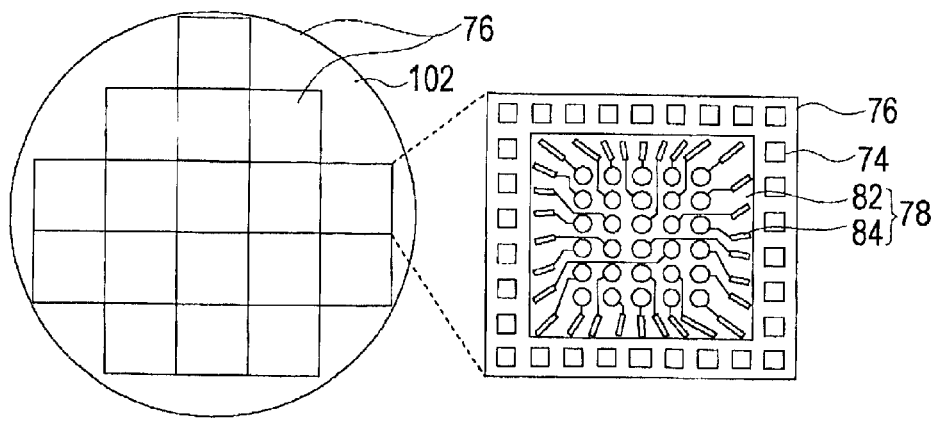
FIG. 11A to FIG. 11C are diagrams of steps subsequent to FIG. 10A to FIG. 10D for manufacturing a semiconductor device according to a fifth embodiment of the present invention.
Figure 11B:
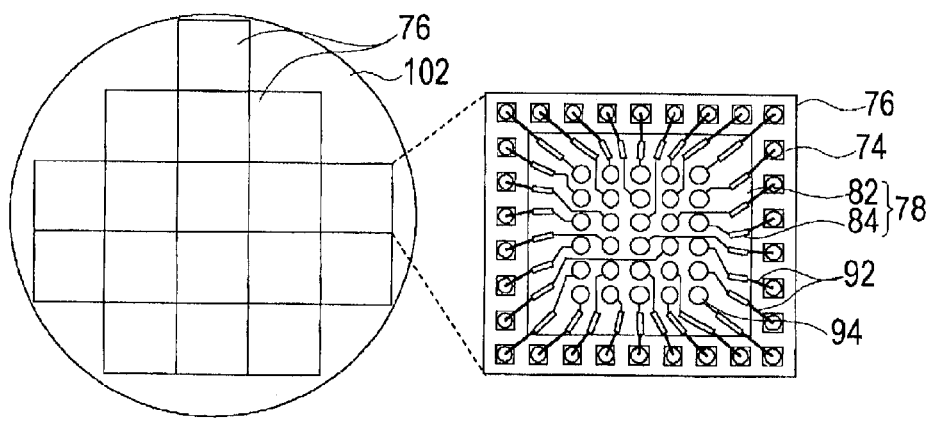
Figure 11C:
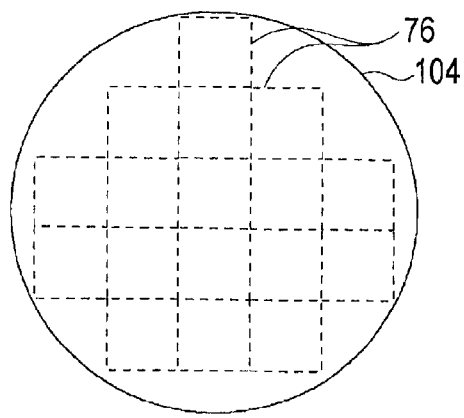

To achieve this, in this embodiment, insulating adhesive film 82x provided with conductive metallic patterns 84 is fixed onto scribe ring 52 by means of scribing tape 54 (FIG. 10B). Next, this is divided up into the rearrangement sheets 78 (FIG. 10C).

Figure 10D:
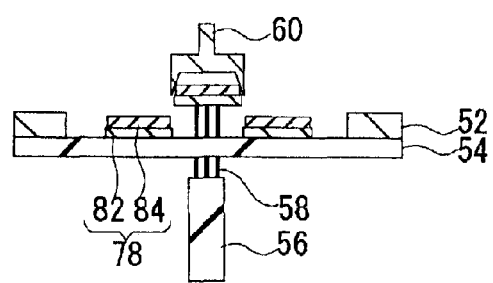

Next, pushing-up pin 58 of pushing-up mechanism component 56 of the dicing machine is pushed up. By this means, the rearrangement sheets 78 formed by the dividing step are pushed up. After having thus been pushed up, a rearrangement sheet 78 is pulled up by means of collet 60 (FIG. 10D). The divided rearrangement sheets 78 are successively pulled up using this pushing-up mechanism component 56 and collet 60.

Next, the rearrangement sheets 78 that have been pulled up by collet 60 are stuck onto each of the semiconductor elements 76 of semiconductor wafer 102. A plurality of bonding pads 74 are formed on each semiconductor element 76. Rearrangement sheets 78 are stuck onto the regions where bonding pads 74 of semiconductor elements 76 are not formed (FIG. 11A).

Next, bonding pads 74 on semiconductor element 76 and wire connection portions 88 of rearrangement sheets 78 are connected by metallic wires 92 using the wire bond launching system. Continuing from this step, conductive posts 94 are formed by stud bumps produced by existing wire bonds on the rearrangement posts 86 of rearrangement sheets 78 (see FIG. 11B and FIG. 7C).

Next, molded resin 104 is formed on the entire upper surface of semiconductor wafer 102. The rearrangement sheets 78 on the individual semiconductor elements 76, metal wires 92 and stud bumps (conductive posts) 94 on the upper surface of the semiconductor wafer 102 are thereby covered by molded resin 104 (FIG. 11C).

Next, using a grinding machine as conventionally employed, the upper surface of molded resin 104 is ground until the upper surfaces of stud bumps 94 are exposed. For example solder balls 98 are formed on the upper surface of stud bumps 94. These solder balls 98 constitute the electrodes for external connection (see FIG. 9). Semiconductor wafer 102 is then fixed by means of scribing tape to the scribe ring, using a dicing machine. Next, it is divided up into the respective semiconductor elements 72.

The semiconductor device 72 of the fourth embodiment is manufactured at wafer level by going through the above steps.

As a result, the semiconductor devices 72 can be formed together in the condition of semiconductor wafer 102. A considerable shortening of manufacturing time can thereby be achieved, making it possible to achieve a considerable reduction in semiconductor device manufacturing costs.

The first to the third embodiments described above are semiconductor devices of a type in which semiconductor elements are laminated, electrical connection between respective elements not being performed; however, the present invention is not restricted to such a construction. Specifically, the present invention can of course be applied also to semiconductor devices of a construction in which first elements and second elements are electrically connected, for example by wire-bonding, bonding pads of the first element and bonding pads of the second element. Also, the laminated semiconductor elements are not restricted to two, but application is also possible to devices in which further lamination is effected.

As is clear from the above description, a rearrangement sheet according to the present invention comprises an insulating sheet and conductive metallic patterns formed on the insulating sheet.

For example, in a semiconductor device of a type in which chips are laminated (MCP), a rearrangement sheet is interposed between the first element and second element of a construction obtained by laminating a first element and second element in that order on a substrate. When bonding posts formed on the substrate and bonding pads of the first element and bonding pads of the second element must be respectively connected, first of all, connection is effected between the bonding posts and conductive metallic patterns of the rearrangement sheet. Next, these conductive metallic patterns and the bonding pads of the second element are connected. The bonding posts and bonding pads of the first element are produced by wire bonding, in the same way as normally. Since the conductive metallic patterns can be provided in desired positions on the rearrangement sheet, connection between the bonding pads and bonding posts of the second element can be effected irrespective of the position of the metal wires that effect connection between the bonding pads and bonding posts of the first element. Consequently, by means of the rearrangement is sheet according to the present invention, for example in the example described above, rearrangement of the bonding pads of the second element can easily be performed. The degrees of design freedom of the second element can therefore be increased.

Let us consider as an example of the use of a rearrangement sheet according to the present invention for example application to a wafer-level CSP. In the wafer-level CSP, the rearrangement sheet is provided in the regions where bonding pads are not formed of a semiconductor element equipped with a plurality of bonding pads. The conductive metallic patterns of the rearrangement sheet are constituted by for example rearrangement posts of the same number as the bonding pads, wire connection portions of the same number as the bonding pads, and rewiring leads that connect the rearrangement posts and the wire connection portions. The wire connection portions can be formed in positions of the rearrangement sheet where connection with the bonding pads is easy. The bonding pads and the wire connection portions can therefore easily be connected by wire bonding. Conductive posts are provided on the rearrangement posts connected by the wire connection portions and rewiring leads. The upper surface of the semiconductor element is sealed such that the upper surfaces of these conductive posts are exposed. In this way, the bonding pads of the semiconductor device can easily be rearranged on the conductive posts that are exposed from the sealed portion.

Rearrangement of the electrodes onto the conductive metal patterns can therefore easily be performed by sticking rearrangement sheets formed with conductive metallic patterns according to the present invention at desired positions on the under-layer where the electrodes that are to be rearranged are provided.

What is claimed is:

1. A rearrangement sheet adapted to be mounted on a top surface of an element, comprising:
   an insulating sheet having a smaller size in area than the top surface of the element, said insulating sheet having an element mounting region defined thereon; and
   a plurality of conductive metallic patterns formed on the insulating sheet so as to surround, and not extend into, the element mounting region, each of said conductive metallic patterns extending continuously, and in a straight line.

2. The rearrangement sheet according to claim 1, wherein said conductive metallic patterns comprise electrodes for wire bonding with external electrodes.

3. The rearrangement sheet according to claim 1, wherein said conductive metallic patterns are metallic wiring patterns.

4. The rearrangement sheet according to claim 1, wherein said conductive metallic patterns are conductive metal plate patterns.

5. The rearrangement sheet according to claim 4, wherein said conductive metallic patterns comprise a laminated pattern of an underlying plated pattern formed on an upper surface of the insulating sheet and a conductive metal plated pattern formed on this underlying plated pattern.

6. The rearrangement sheet according to claim 1, wherein an insulating adhesive sheet is provided in the element mounting region.

7. The rearrangement sheet according to claim 1, wherein said insulating sheet is an insulating adhesive sheet.

8. The rearrangement sheet according to claim 1, wherein said conductive metallic patterns are disposed directly on a surface of said insulating sheet.

9. The rearrangement sheet according to claim 1, wherein each of said conductive metallic patterns extends levelly from an edge of said insulating sheet to the element mounting region.

10. The rearrangement sheet according to claim 1, wherein the conductive metallic patterns are disposed at a north, south, east and west side of the element mounting region.

11. The rearrangement sheet according to claim 1, wherein the element mounting region is adapted for mounting a semiconductor element therein.

12. A semiconductor device comprising:
   a substrate;
   a first element provided with a plurality of first bonding pads, and being disposed in a first element formation region on an upper surface of the substrate;
   a second element provided with a plurality of second bonding pads, the second element being disposed over an upper side of the first element;
   a plurality of bonding posts provided on the upper surface of said substrate, and outside so as to surround the first element formation region;
   first wires that electrically connect respective ones of the bonding posts with respective ones of said first bonding pads; and
   a rearrangement sheet provided with an insulating sheet, and a plurality of conductive metallic patterns that are formed on the insulating sheet, the rearrangement sheet being provided between said first element and said second element;
   wherein said conductive metallic patterns are formed in a region exposed from said second element, so that the conductive metallic patterns surround, and do not extend under, the second element, said conductive metallic patterns each including a first portion that can be reached by a straight line extending from another respective one of the bonding posts for a second pad connection, without contacting or crossing said first bonding pads, and a second portion, capable of wire bonding with a respective one of the second bonding pads, thereby coupling the another respective one of the bonding post to the second bonding pad;
   the first portions and the another respective ones of the bonding posts being electrically connected by first relay wires; and
   said second portion and said respective ones of the second bonding pads being electrically connected by second relay wires.

13. The semiconductor device according to claim 12, wherein said conductive metallic patterns include an underlying plated pattern formed on an upper surface of said insulating sheet, and a conductive metal plated pattern formed on the underlying plated pattern.

14. The semiconductor device according to claim 12, wherein said conductive metallic patterns are metallic wiring patterns formed on an upper surface of said insulating sheet.

15. The semiconductor device according to claim 12, wherein said conductive metallic patterns comprise a metallic wiring pattern formed on an upper surface of said insulating sheet and conductive metal plated patterns provided on the metallic wiring patterns including the first portion and including the second portion.

16. A semiconductor device, comprising:
   a semiconductor element having a plurality of bonding pads formed on an upper surface thereof;
   a rearrangement sheet comprising an insulating sheet and conductive metallic patterns electrically connected with said bonding pads, stuck onto the upper surface of the semiconductor element other than in a region where the bonding pads are formed so as to be surrounded by the bonding pads; and
   a sealed portion that seals the upper surface of said semiconductor element so as to cover said rearrangement sheet;
   wherein said conductive metallic patterns comprise rearrangement posts of a same number as said bonding pads, wire connection portions of the same number as the bonding pads, the rearrangement posts and the wire connection portions being arranged so that the rearrangement posts are surrounded by the wire connection portions, and rewiring leads that connect said rearrangement posts and said wire connection portions;
   said wire connection portions and said bonding pads are connected by metallic wires,
   conductive posts are formed on an upper surface of said rearrangement posts; and
   part of the conductive posts is exposed from said sealed portion.

17. The semiconductor device according to claim 16, wherein said conductive metallic patterns are conductive metallic wiring patterns.

18. The semiconductor device according to claim 16, wherein said conductive metallic patterns are conductive metal plated patterns.

19. The semiconductor device according to claim 16, wherein, of said conductive metallic patterns, said rearrangement posts and said rewiring leads are constituted by first metallic wiring patterns; and
said wire connection portions are constituted by second metallic wiring patterns and conductive metal plated patterns formed on the second metallic wiring patterns.

20. In combination, an element having a top surface; and a rearrangement sheet mountable on the top surface of the element, the rearrangement sheet including:
an insulating sheet having a smaller size in area than the top surface of the element, the insulating sheet having an element mounting region defined thereon; and
a plurality of conductive metallic patterns formed on the insulating sheet so as to surround, and not extend into, the element mounting region, each of the conductive metallic patterns extending continuously, and in a straight line.

21. The combination according to claim 20, wherein the conductive metallic patterns comprise electrodes for wire bonding with external electrodes.

22. The combination according to claim 20, wherein the conductive metallic patterns are metallic wiring patterns.

23. The combination according to claim 20, wherein the conductive metallic patterns are conductive metal plated patterns.

24. The combination according to claim 23, wherein the conductive metallic patterns comprise a laminated pattern of an underlying plated pattern formed on an upper surface of the insulating sheet and a conductive metal plated pattern formed on this underlying plated pattern.

25. The combination according to claim 20, further comprising an insulating adhesive sheet provided in the element mounting region.

26. The combination according to claim 20, wherein the insulating sheet is an insulating adhesive sheet.

27. The combination according to claim 20, wherein the conductive metallic patterns are disposed directly on a surface of the insulating sheet.

28. The combination according to claim 20, wherein each of the conductive metallic patterns extends levelly from an edge of the insulating sheet to the element mounting region.

29. The combination according to claim 20, wherein the conductive metallic patterns are disposed at a north, south, east and west side of the element mounting region.

30. The combination according to claim 20, further comprising a semiconductor element mountable in the element mounting region.

* * * * *